United States Patent [19]

Dreps et al.

[11] Patent Number: 5,039,952
[45] Date of Patent: Aug. 13, 1991

[54] ELECTRONIC GAIN CELL

[75] Inventors: Daniel M. Dreps, Endicott; Raymond P. Rizzo, Vestal, both of N.Y.

[73] Assignee: International Business Machines Corp., Armonk, N.Y.

[21] Appl. No.: 512,304

[22] Filed: Apr. 20, 1990

[51] Int. Cl.$^5$ .............................................. H03F 3/45
[52] U.S. Cl. ..................................... 330/261; 330/252
[58] Field of Search ................ 330/252, 261; 307/494

[56] References Cited

U.S. PATENT DOCUMENTS

| | | | |
|---|---|---|---|
| 3,417,263 | 12/1968 | Thomas | 307/229 |
| 3,533,008 | 10/1970 | Lee | 330/61 |
| 3,573,645 | 4/1971 | Wheatley, Jr. | 330/15 |
| 3,643,107 | 2/1972 | Gilbreath | 307/229 |
| 3,693,106 | 9/1972 | Long et al. | 330/17 |
| 3,702,444 | 11/1972 | Owen | 330/28 |
| 3,818,365 | 6/1974 | Hanson | 330/53 |
| 3,943,463 | 3/1975 | Kuno et al. | 331/107 |
| 3,980,963 | 9/1976 | Doi | 330/23 |
| 3,982,115 | 9/1976 | Traa | 235/197 |
| 3,986,113 | 10/1976 | Vifian | 324/85 |
| 4,002,993 | 1/1977 | vande Plassche | 330/30 |
| 4,088,963 | 5/1978 | Machida et al. | 330/284 |
| 4,155,047 | 5/1979 | Rubens et al. | 330/284 |
| 4,163,950 | 8/1979 | Damm et al. | 330/252 |
| 4,207,480 | 6/1980 | Simeau | 307/308 |
| 4,240,040 | 12/1980 | Saari | 330/255 |
| 4,243,946 | 1/1981 | Wang | 330/265 |
| 4,259,643 | 3/1981 | Monticelli | 330/288 |
| 4,322,690 | 3/1982 | Laupman | 330/298 |
| 4,322,770 | 3/1982 | Sendelweck | 361/91 |
| 4,403,199 | 9/1988 | Blackmer | 330/278 |
| 4,439,696 | 3/1984 | Yokoya | 307/494 |
| 4,468,629 | 8/1984 | Choma, Jr. | 330/260 |
| 4,542,350 | 9/1985 | Akazawa et al. | 330/293 |
| 4,590,417 | 5/1986 | Tanaami et al. | 323/229 |
| 4,605,906 | 8/1986 | Miller | 330/149 |
| 4,663,599 | 5/1987 | Patch | 330/311 |
| 4,683,443 | 7/1987 | Young et al. | 330/277 |
| 4,885,547 | 12/1989 | Bell, Jr. et al. | 330/254 |
| 4,914,401 | 4/1990 | Mäder | 330/261 |

FOREIGN PATENT DOCUMENTS 45-14004 5/1970 Japan .
62-13107 1/1987 Japan .

OTHER PUBLICATIONS

Betts, "Diode-Connected Transistor as Load", *IBM Technical Disclosure Bulletin*, vol. 24, No. 10, Mar. 1982, pp. 5082-5083.

*Primary Examiner*—James B. Mullins
*Attorney, Agent, or Firm*—Arthur J. Samodovitz

[57] ABSTRACT

An amplifier circuit comprises first and second gain cells connected in cascade. Each of the gain cells comprises first and second common emitter differential transistors, a current source coupled to the emitters of the transistors, a first plurality of forward biased, series diodes connected between a power supply terminal and a base of the first transistor, and a second plurality of forward biased, series diodes connected between the power supply terminal and a base of the second transistor. A collector of the first transistor of the first gain cell is connected to the base of the first transistor of the second gain cell, and a collector of the second transistor of a first gain cell is connected to the base of the second transistor of the second gain cell. Because of the low inherent resistance of the biasing diodes, the operating speed of the amplifier is large, and the current amplification can be large without exceeding the power supply voltage. The current source limits the gain for high level signals without causing saturation of the transistors and therefore, does not comprise operating speed. The gain of each cell equals the numbers of diodes connected to the base of the transistor until the level of the current source.

10 Claims, 3 Drawing Sheets

ELECTRONIC GAIN CELL

BACKGROUND OF THE INVENTION

The invention relates generally to electronic amplifiers, and deals more particularly with a multistage amplifier which operates at high speed and requires only a low power supply voltage.

For some applications, such as a fiber optic digital receiver, high gain and high speed/high band width are essential. For example, some fiber optic cables used for digital communication between computers are required to transmit and receive 800 megabits per second, and faster speeds will be required in the future. Also, it is preferable to operate the amplifier from the same power supply used for the digital signals, and such a power supply may provide a low voltage. For example, if the digital signals are at a TTL level, the power supply voltage is five volts.

Many types of amplifiers were previously known. For example, a very common amplifier comprises a bipolar transistor, a large DC biasing resistor connected between the base of the transistor and the power supply, an emitter resistor connected between the emitter of the transistor and ground, and a collector resistor connected between the collector of the transistor and the power supply. Such an amplifier is useful for moderate speeds. However, the transistor in the amplifier inherently includes a parasitic capacitance at the base, and this capacitor is located in parallel with the base resistor. Consequently, the amplifier has a substantial RC time constant at its input, which time constant reduces the speed and band width of the amplifier. Differential amplifiers were also known for increased sensitivity.

It was also known to use "Gilbert Cells" to provide a high speed/high band width amplifier. These cells can be combined to yield high gain. However, each cell requires 0.5–1.0 volts of power supply voltage swing to operate, and the cells are stacked "vertically" from the power supply to the ground to combine them. Consequently, the maximum gain possible with a small power supply voltage such as 5 volts is limited.

There is yet another requirement that the fiber optic amplifier should meet. The photo signals impinging at the input of the amplifier may vary by a factor of 1000 in energy due to the proximity of the LED or LASER to the corresponding photosensitive diode, fabrication tolerance and other factors, and the amplifier should compensate for these variations to provide a manageable voltage output range. In the prior art, single ended amplifier noted above having the base and other resistors, the transistor will saturate to limit the output voltage. However, the saturation condition slows the subsequent response of the transistor, i.e. turn-off. The Gilbert Cell also is not suitable for a wide range of inputs because vertical stacking limits the allowable DC component that an input can have in relation to the power supply voltage.

Accordingly, a general object of the present invention is to provide a high speed/high band width amplifier.

Another general object of the present invention is to provide a multistage amplifier of the foregoing type which can operate at a low power supply voltage.

Another object of the present invention is to provide an amplifier of the foregoing types which is operable over a wide range of signal inputs, and yields an output within a manageable voltage range.

Still another object of the present invention is to provide an amplifier of the foregoing types which can be fabricated as a densely populated integrated circuit.

SUMMARY OF THE INVENTION

The invention resides in an amplifier comprising first and second gain cells connected in cascade. Each of the gain cells comprises first and second common emitter. differential transistors, a current source coupled to the emitters of the transistors, a first plurality of forward biased, series diodes connected between a power supply terminal and a base of the first transistor, and a second plurality of forward biased, series diodes connected between the power supply terminal and a base of the second transistor. A collector of the first transistor of the first gain cell is coupled to the base of the first transistor of the second gain cell, and a collector of the second transistor of the first gain cell is coupled to the base of the second transistor of the second gain cell. Because of the low inherent resistance of the biasing diodes, the operating speed of the amplifier is large, and the current amplification can be large without exceeding the power supply voltage. The current source limits the gain for high level signals without causing saturation of the transistors and therefore, without compromising operating speed. According to one feature of the invention, the inherent resistance of each diode and the inherent resistance of the base and the emitter layers of each transistor is the same as the others so that the gain of each cell equals the number of diodes connected to the base of the transistor.

DETAILED DESCRIPTION OF PREFERRED EMBODIMENTS

Figure 1:
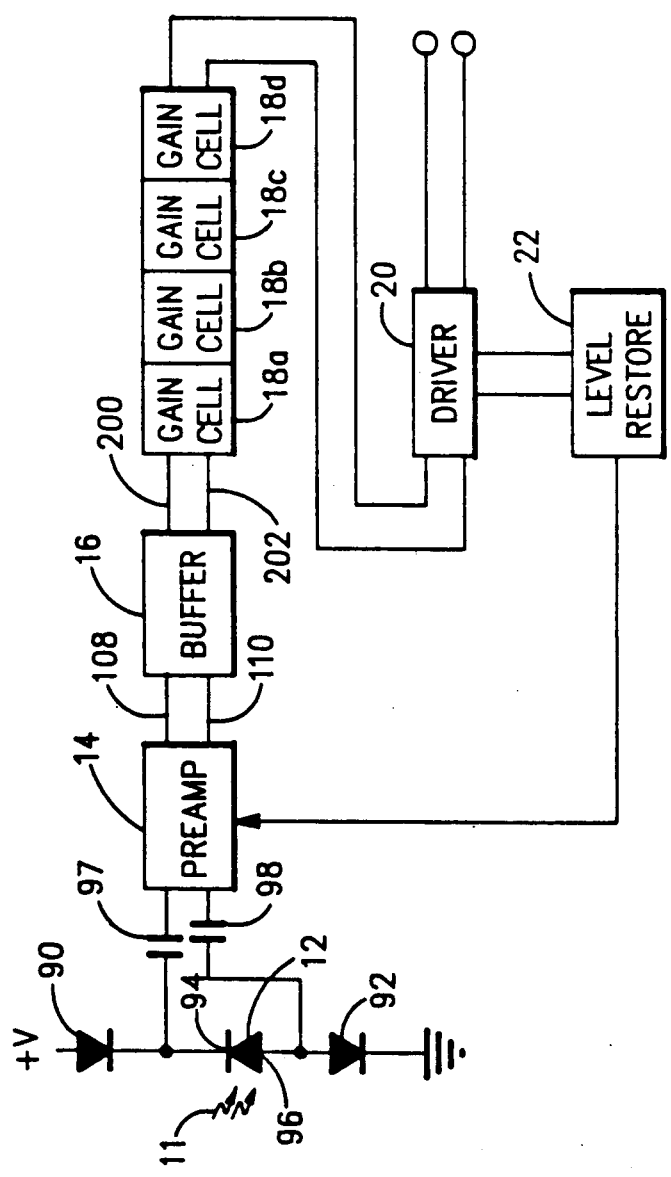
FIG. 1 is a block diagram of a fiber optic receiver which utilizes the present invention.

Referring now to the drawings in detail wherein like reference numerals indicate like elements throughout the several views, FIG. 1 illustrates a fiber optic receiver circuit generally designated 10 which utilizes the present invention. Circuit 10 comprises a photosensitive pin diode 12 at its input, a pre-amplifier 14 connected across the pin diode, a buffer circuit 16 connected to the output of the pre-amplifier, a plurality of gain cells 18 A–D connected in cascade at the output of the buffer circuit, a driver circuit 20 connected at the output of the gain cell 18D and a level restorer circuit 22 connected between the driver and the pre-amplifier.

Figure 2:
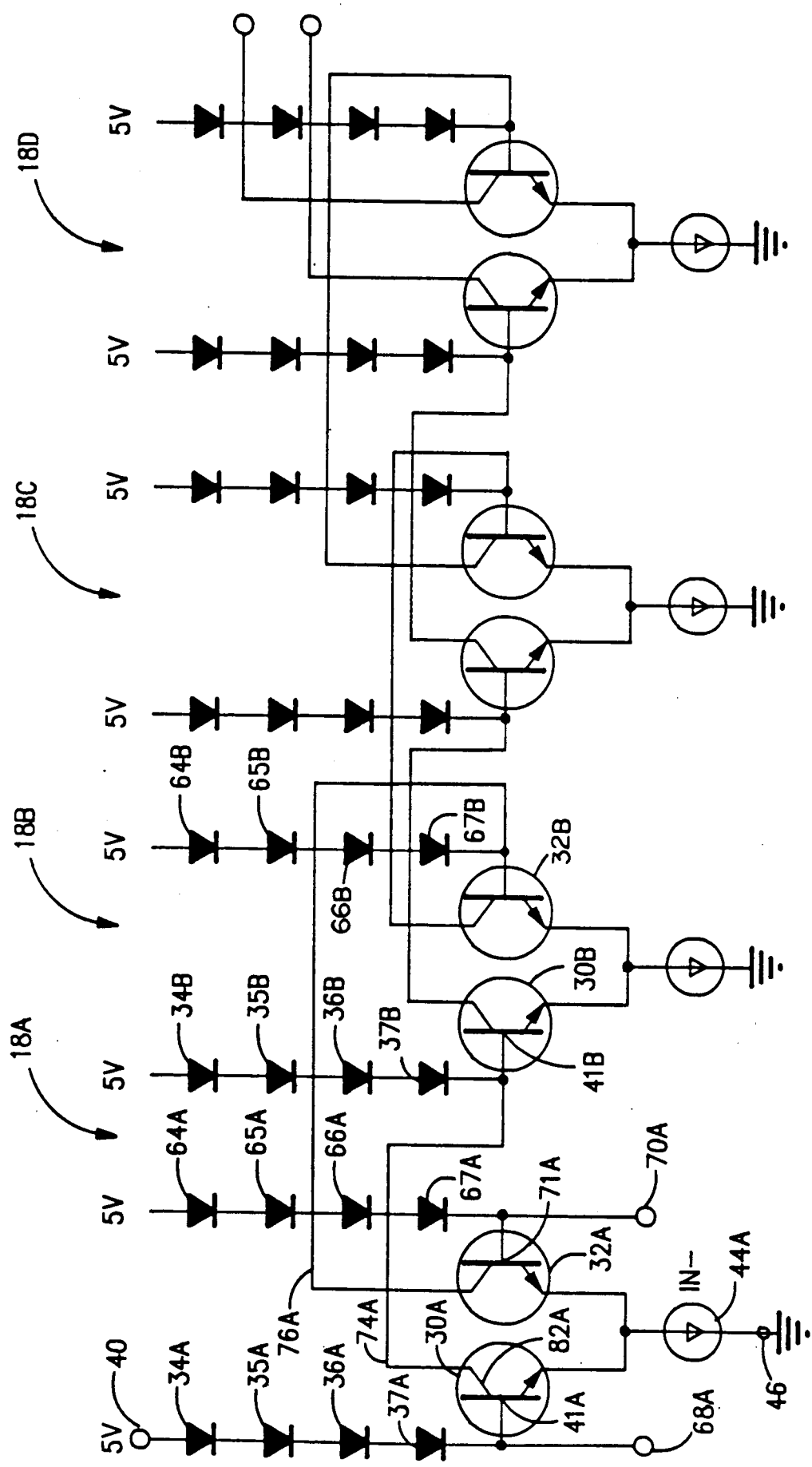
FIG. 2 is a circuit diagram of four cascaded gain cells of FIG. 1.

FIG. 2 illustrates cascaded gain cells 18A–18D, and it should be noted that more or fewer gain cells can be cascaded if desired. Gain cell 18A comprises differential bipolar transistors 30A and 32A whose emitters are connected together, diodes 34A–37A connected in series between a positive voltage, power supply terminal 40 and a base 41A of transistor 30A and a current source 44A connected between the emitter of each of transistors 30A and 32A and a grounded power supply terminal 46. With this series arrangement of diodes 34A-37A, the base of transistor 30 is biased at a DC voltage which equals the positive power supply voltage minus the voltage drop across each of diodes 34A-37A. In the illustrated embodiment, the biased voltage is approximately 1.8 volts.

Figure 3:
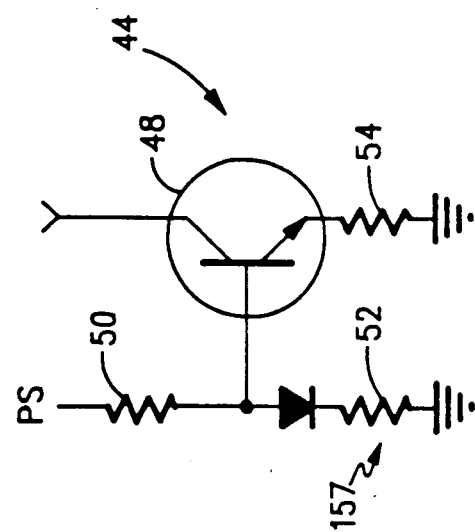
FIG. 3 is a circuit diagram of a current sink of FIG. 2.

By way of example, current source 44A comprises a transistor 48 (FIG. 3) whose base is maintained at a constant DC voltage by a voltage divider formed by resistors 50 and 52, and a resistor 54 connected between the emitter of transistor 48 and ground. With the base of transistor 48 maintained at a constant voltage by the voltage divider, the emitter of transistor 48 is maintained at a fixed voltage which is approximately 0.8 volts below the base voltage. Thus, the current sunk into the collector of transistor 48 is fixed and approximately equals the emitter voltage divided by the resistance of resistor 54. Diode 157 temperature compensates transistor 48, so as to maintain a constant current sink over temperature variations. This is accomplished by matching the base-emitter voltage of transistor 48 with the forward drop of diode 157. The current source 44A limits the bias current to a suitable operating level for transistors 30A and 32A, and also limits the collector current through transistors 30A and 32A to maintain the output current in a manageable range despite the wide range of inputs as described in more detail below.

Transistor 32A and biasing diodes 64A-67A are identical in operation and configuration as transistor 30A and diode 34A-37A. A differential input voltage between terminals 68A and 70A is applied to the base 41A of transistor 30A and a base 71A of transistor 32A. Gain cell 18A also provides differential outputs 74A and 76A corresponding to the differential inputs 68A and 70A, respectfully.

Figure 4:
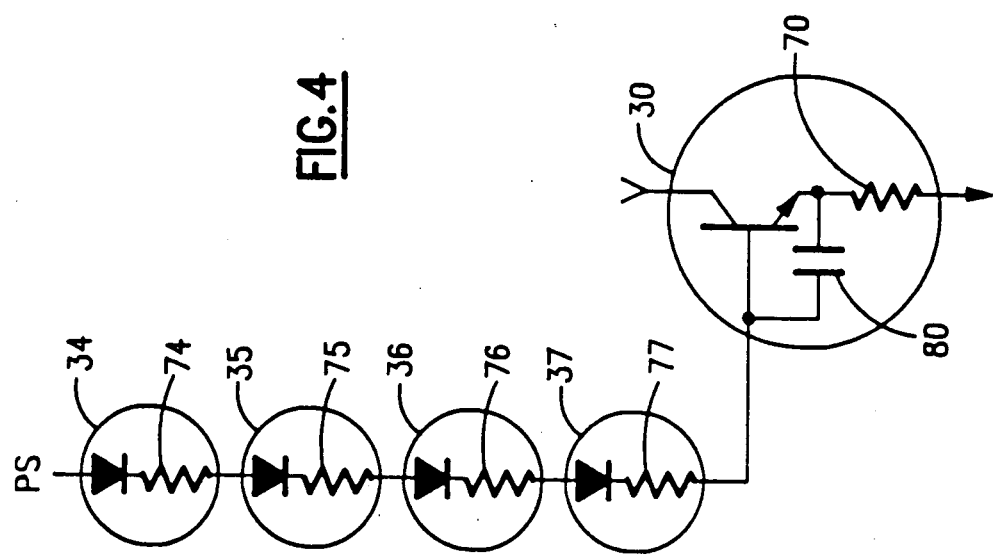
FIG. 4 is an equivalent circuit diagram of part of a gain cell of the circuit of FIG. 2, and is intended to explain the inner workings of the gain cell.

FIG. 4 illustrates the gain provided by gain cell 18A. In reality, transistor 30A includes a finite resistance 70 which is caused by the inherent resistivity of the N and P layers of the base and emitter layers of transistor 30A. Similarly, each of the diodes 34-37 comprises a resistance 74-77, respectively which is caused by the inherent resistivity of the P semiconductor layer and the N semiconductor layer of each diode. When an AC current is injected into base 41A of transistor 30A, the current instantaneously changes the base voltage according to the equation:

$V_{AC}=4RI_{AC}$ where $V_{AC}$ is the instantaneous voltage at base 41A, R is the resistance of each diode (and transistor) and $I_{AC}$ is the injected current. Ignoring the DC voltage drop from the base to emitter of transistor 30A and considering only the AC voltage at the emitter of transistor 30A, the AC voltage at emitter 30A equals the AC voltage at base 41A. The AC voltage at the emitter of transistor 30A is determined by the following equation:

$V_{AC}=I_{COL} \times R$ where $I_{COL}$ is the collector current and R is the resistance of resistor 70. In the preferred embodiment of the invention, all of the resistances 74-77 and 70 have the same resistance. This is realizable because all of the resistors are fabricated as an intergrated circuit and are made simultaneously. Preferably, the resistance is in the range 10-50 ohms, and is for example approximately 15 ohms. Combining the foregoing two equations yields the result:

$I_{COL}R = 4R\ I_{AC}$ or $I_{COL}=4I_{AC}$. Thus, the AC current gain of gain cell 18 equals four (until the collector current equals that of the current source).

It should also be noted that despite a parasitic capacitance 80 across the base to emitter of transistor 30A, the speed and band width of cell 18A is large because resistances 70 and 74-77 are small, as noted above. Thus, the RC time constant is small. Moreover, because the biasing (and load) are provided by diodes, the cell can be physically small to provide a densely populated integrated circuit.

FIG. 4 and the foregoing equations also illustrate that the gain of transistor 30A equals the number of diodes connected between power supply 40 and base 41A, which number can be decreased or increased from the four shown in FIG. 4 depending on the power supply voltage. The number of diodes which can be connected between the power supply and base 41A is limited by the power supply voltage because the base of transistor 30 must be maintained well above ground voltage 46. Thus, if the power supply voltage is increased from the illustrated example of the volts, then additional diodes can be placed in series with diodes 34A-37A to increase the gain.

The gain of cell 18 is limited by the current source 44 such that the instantaneous (AC) collector current cannot exceed the current of the current source. By way of example, the current source is limited to 2MA in sinking capability. When the two currents are equal, then the gain of cell 18 is less than the number of diodes at the base of the transistor. This nonlinearity in gain is advantageous because the signal transmitted by the light 11 is digital, there is no need to exceed a threshold level for the amplified signal, and any excess signal must ultimately be clipped. Also, it should be noted that the limiting effect of the current source does not cause saturation of transistors 30 or 32 so that the operating speed is not compromised.

Collector 74A of transistor 30A is connected to base 41B of transistor 30B. Thus, the load of transistor 30A is the set of diodes 34B-37B connected to the base of transistor 30B. Similarly, the load of transistor 32A is the set of diodes 64B-67B. gain cell 18C is similarly cascaded with gain cell 18B, and gain cell 18D is similarly cascaded with gain cell 18C. Because the resistances of the load diodes is small, the voltage swing is small for each of the stages in 18A-18C. This is advantageous because this permits many stages to be connected in cascade and still operate from a low power supply voltage. The driver circuit 20 has a resistive load to provide maximum voltage swing.

Describing now the input of circuit 10, light 11 impinges upon photosensitive diode 12 to create an electrical response, i.e. conductivity of diode 12. In the preferred embodiment of circuit 10, photosensitive diode 12 is a P-I-N diode. Such a diode yields a one-for-one gain i.e. one proton releases one electron. As further illustrated in FIG. 1, photosensitive diode 12 is biased by PN diodes 90 and 92. It should be noted that the bias provided by diodes 90 and 92 provides a very low thermal noise source because the diodes have a very low series resistance. This is advantageous because of the large amplification provided by the remainder of circuit 10 and the low signal strength provided by photosensitive diode 12. Diodes 90 and 92 provide a small amount of shot noise found in the associate P/N semiconductor junctions; however, shot noise is a function of current through the junction and the amount of current is small.

Alternatively, a resistor can be substituted for each of diodes 90 and 92, to provide the bias. However, in this alternate design, the thermal noise would increase due to the increase in size of the resistor. It should also be noted that the bias provided by diodes 90 and 92 is advantageous because the diodes allow a large dynamic range of light input i.e., the voltage drop across the biasing diode 90 and 92 varies little due to the increase in current of the signal and therefore the biasing voltage remains approximately constant.

An anode 96 and a cathode 94 of photosensitive diode 12 are applied to differential inputs of differential, transimpedance pre-amplifier 14 via AC coupling capacitors 97 and 98.

Figure 5:
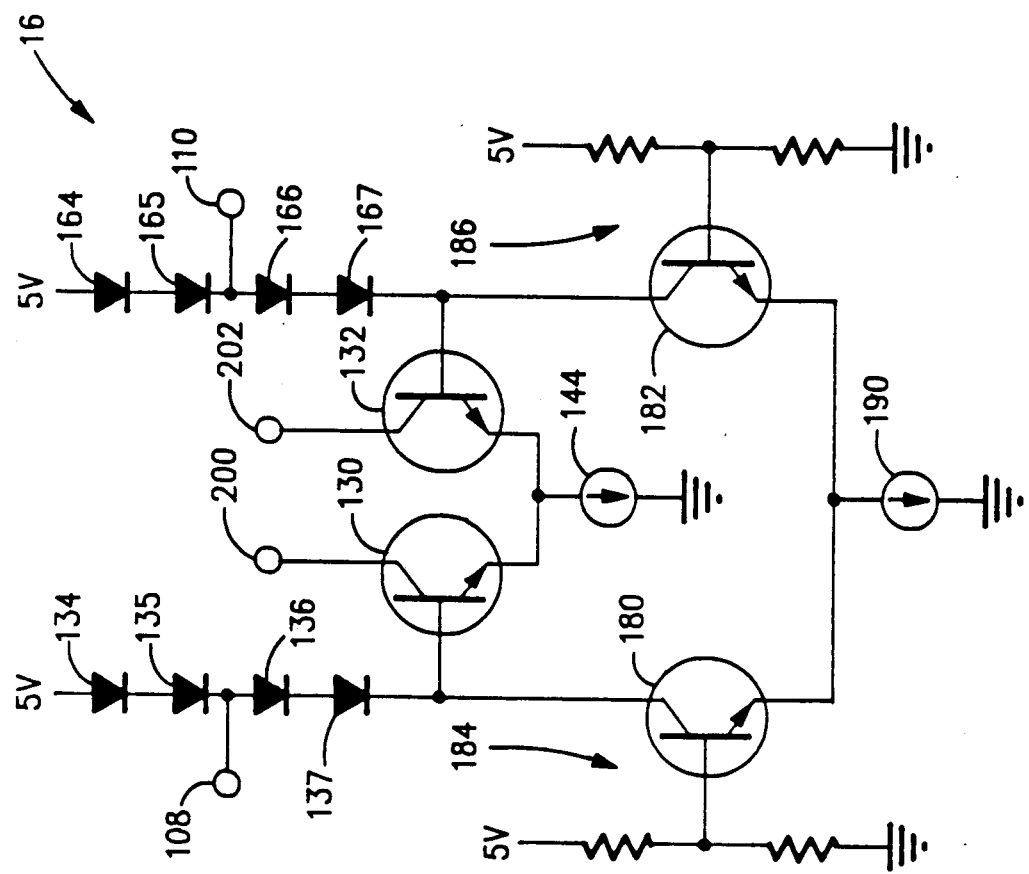
FIG. 5 is a circuit diagram of a buffer circuit of FIG. 1.

The differential outputs 108 and 110 pre-amplifier 14 are applied to inputs of buffer circuit 16 as illustrated in FIG. 5. Buffer circuit 16 comprises a first set of diodes 134–137 which biases a transistor 130 and a second set of diodes 164–167 which biases a transistor 132 in a similar manner as that in gain cell 18A. Also as in gain cell 18A, a current source 144 of the buffer circuit limits the bias and output currents. In contrast to gain cell 18A, however, the inputs of buffer circuit 16 are supplied between diodes 135 and 136 and between diodes 165 and 166. This affects the DC voltage of the corresponding signals applied to the bases of transistors 130 and 132, but otherwise does not alter the gain or performance of buffer circuit 16 compared to gain cell 18A. One purpose of buffer circuit 16 is to convert the DC voltage swing of pre-amplifier 14 to that of an AC current swing into gain cell 18A. The output of pre-amplifier 14 is an amplified AC signal plus a DC bias, and the DC bias is higher than gain cell 18A can accept at the bases 41A and 71A of transistors 30A and 32A. Buffer circuit 16 lowers the output DC voltage and acts as a voltage level translator, using diodes 134–135 and 164–165 and transistors 180 and 182. Transistors 180 and 182 have a fixed base voltage caused by voltage dividers 184 and 186, respectively. A current source 190 connected to the emitters of transistors 180 and 182 performs the function of current bias for diode strings 134 through 137 and 164 through 167.

Driver circuit 20 is a differential amplifier and provides voltage gain and low output impedance.

The level restore circuit 22 provides negative feedback from driver 20 to pre-amplifier 14 to compensate for transistor mismatches throughout circuit 14 i.e. unequal DC biases, voltage drops, etc. and thereby balances circuit 14.

Based on the foregoing, cascaded buffer and gain cells according to the present invention have been disclosed. However, numerous modifications and substitutions may be made without deviating from the scope of the invention. For example, pnp transistors can be substituted for the npn transistors shown, in which case the diodes would be connected between the base of the respective transistors and ground and the current source would be connected between the emitters and a higher potential. Therefore, the invention has been disclosed by way of illustration and not limitation and reference should be made to the following claims to determine the scope of the invention.

We claim:

1. An amplifier comprising:
   first and second common emitter differential transistors,
   a current source coupled to the emitters of said transistors,
   a first plurality of forward biased, series diodes connected between a power supply terminal and a base of said first transistor,
   a second plurality of forward biased, series diodes connected between said power supply terminal and a base of said second transistor;
   a first differential input between two diodes of said first plurality; and
   a second differential input between two diodes of said second plurality.

2. An amplifier circuit as set forth in claim 1 wherein there are four diodes in said first plurality and said first differential input is connected between the middle two diodes, and there are four diodes in said second plurality and said second differential input is connected between the middle two diodes.

3. An amplifier as set forth in claim 1 wherein there are the same number of diodes in said first plurality as in said second plurality.

4. An amplifier circuit as set forth in claim 3 wherein an inherent resistance in the base and emitter semiconductor layers in each transistor is approximately equal in magnitude to an inherent resistance in the semiconductor layers of said diodes at the base of said transistor.

5. An amplifier as set forth in claim 4 wherein there are no other significant resistors besides the inherent resistances of said diodes between said base of said transistor and said power supply terminal in series with said diodes, no other significant resistors besides the inherent resistance of said emitter of said transistor located between the emitter of said transistor and the associated current source such that a gain of said differential transistors equals approximately the number of diodes in each plurality over a substantial portion of the operating range.

6. An amplifier as set forth in claim 1 wherein there are four diodes in said first plurality of diodes and four diodes in said second plurality of diodes, and said cells are adapted to operate from a five volt power supply via said power supply terminal.

7. An amplifier circuit as set forth in claim 1 wherein an inherent resistance in the base and emitter semiconductor layers in each transistor is approximately equal in magnitude to an inherent resistance in the semiconductor layers of said diodes at the base of said transistor.

8. An amplifier as set forth in claim 7 wherein there are no other significant resistors besides the inherent resistances of said diodes between said base of said transistor and said power supply terminal in series with said diodes, no other significant resistors besides the inherent resistance of said emitters of said transistor located between the emitter of said transistor and the associated current source such that a gain of each cell of said amplifier circuit equals approximately the number of diodes in each plurality over a substantial portion of the operating range.

9. An amplifier circuit as set forth in cliam 8 wherein said current source is limited in its capacity to sink current such that when the amplified signal of the associated cell equals said capacity, the gain of said cell becomes less than the number of diodes at the base of each transistor in said cell.

10. An amplifier comprising:
    first and second transistors differentially coupled to each other,
    a current source coupled to collector-emitter junctions of said transistors, a first plurality of series diodes connected for forward bias between a power supply terminal and a base of said first transistor, a second plurality of series diodes connected for forward bias between said power supply terminal and a base of said second transistor;

means for receiving a first differential input between two diodes of said first plurality; and means for receiving as second differential input between two diodes of said second plurality.

* * * * *